(12) United States Patent
Ikegami

(10) Patent No.: US 12,295,093 B2
(45) Date of Patent: May 6, 2025

(54) SIGNAL PROCESSING BOARD AND IMAGE FORMING APPARATUS

(71) Applicant: KYOCERA Document Solutions Inc., Osaka (JP)

(72) Inventor: Shotaro Ikegami, Osaka (JP)

(73) Assignee: KYOCERA Document Solutions Inc., Osaka (JP)

( * ) Notice: Subject to any disclaimer, the term of this patent is extended or adjusted under 35 U.S.C. 154(b) by 118 days.

(21) Appl. No.: 18/472,051

(22) Filed: Sep. 21, 2023

(65) Prior Publication Data

US 2024/0107661 A1 Mar. 28, 2024

(30) Foreign Application Priority Data

Sep. 28, 2022 (JP) .................................. 2022-154696

(51) Int. Cl.
*H05K 1/02* (2006.01)

(52) U.S. Cl.
CPC . *H05K 1/0231* (2013.01); *H05K 2201/09345* (2013.01); *H05K 2201/09618* (2013.01); *H05K 2201/09636* (2013.01); *H05K 2201/10159* (2013.01); *H05K 2201/10651* (2013.01)

(58) Field of Classification Search
CPC ....... H05K 1/0231; H05K 1/162; H05K 1/181
See application file for complete search history.

(56) References Cited

U.S. PATENT DOCUMENTS

2012/0201087 A1 8/2012 Mizuno et al.

FOREIGN PATENT DOCUMENTS

JP 2012164794 A 8/2012

*Primary Examiner* — Jeremy C Norris
(74) *Attorney, Agent, or Firm* — Alleman Hall & Tuttle LLP

(57) ABSTRACT

A signal processing board includes a six-layer substrate. A plurality of signal transmission planes are formed in a first layer, a third layer, a fourth layer, and a sixth layer. A first ground plane is formed in a second layer. A first power supply plane is formed in a fifth layer and electrically connected to the first semiconductor element. A second power supply plane is formed in the fifth layer and electrically connected to the second semiconductor element. A second ground plane is formed in the fifth layer. A first bypass capacitor is electrically connected to the first power supply plane and the second ground plane. A second bypass capacitor is electrically connected to the second power supply plane and the second ground plane.

5 Claims, 3 Drawing Sheets

SIGNAL PROCESSING BOARD AND IMAGE FORMING APPARATUS

INCORPORATION BY REFERENCE

This application is based upon and claims the benefit of priority from the corresponding Japanese Patent Application No. 2022-154696 filed on Sep. 28, 2022, the entire contents of which are incorporated herein by reference.

The present disclosure relates to a signal processing board and an image forming apparatus including a six-layer substrate.

BACKGROUND

An image forming apparatus such as a printer, a copier, or a multifunction peripheral is provided with a printing device and a signal processing board. The signal processing board performs signal processing for controlling the printing device and other devices.

For example, the signal processing board includes a multilayer substrate, and a plurality of semiconductor elements mounted on the multilayer substrate. In addition, a plurality of wiring planes are formed in a plurality of wiring layers in the multilayer substrate.

The plurality of wiring planes are electrically connected to some or all of the plurality of semiconductor elements. For example, the plurality of semiconductor elements include a memory element and a control element for controlling the printing device.

The demand for smaller and higher density signal processing boards has led to an increase in the number of layers of the multilayer substrate. For example, it is known that the multilayer substrate of the signal processing board is a four-layer substrate or a six-layer substrate.

SUMMARY

A signal processing board according to one aspect of the present disclosure includes a six-layer substrate, a first semiconductor element, a second semiconductor element, a plurality of signal transmission planes, a first ground plane, a first power supply plane, a second power supply plane, a second ground plane, a first bypass capacitor, and a second bypass capacitor. The six-layer substrate is a substrate in which six wiring layers are stacked. The first semiconductor element and the second semiconductor element are arranged on an outer surface of a first layer of the six wiring layers. The plurality of signal transmission planes are formed in the first layer, a third layer, a fourth layer, and a sixth layer of the six wiring layers, and are electrically connected to one or both of the first semiconductor element and the second semiconductor element. The first ground plane is formed in a second layer of the six wiring layers, and is electrically connected to the first semiconductor element and the second semiconductor element. The first power supply plane is formed in a fifth layer of the six wiring layers, and is electrically connected to the first semiconductor element. The second power supply plane is formed in the fifth layer of the six wiring layers, and is electrically connected to the second semiconductor element. The second ground plane is formed in the fifth layer of the six wiring layers, and is electrically connected to the first semiconductor element and the second semiconductor element. The first bypass capacitor is arranged on an outer surface of the first layer or the sixth layer, and is electrically connected to the first power supply plane and the second ground plane. The second bypass capacitor is arranged on the outer surface of the first layer or the sixth layer, and is electrically connected to the second power supply plane and the second ground plane.

An image forming apparatus according to another aspect of the present disclosure includes a printing device configured to form an image on a sheet and the signal processing board. The signal processing board is a board on which a memory element and an element including a processor configured to control the printing device are mounted.

This Summary is provided to introduce a selection of concepts in a simplified form that are further described below in the Detailed Description with reference where appropriate to the accompanying drawings. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Embodiments of the present disclosure will be described below with reference to the drawings. It is noted that the following embodiments are examples of embodying the present disclosure and do not limit the technical scope of the present disclosure.

First Embodiment

The signal processing board 6 according to a first embodiment is a control board of an image forming apparatus 10.

[Configuration of Image Forming Apparatus 10]

Figure 1:
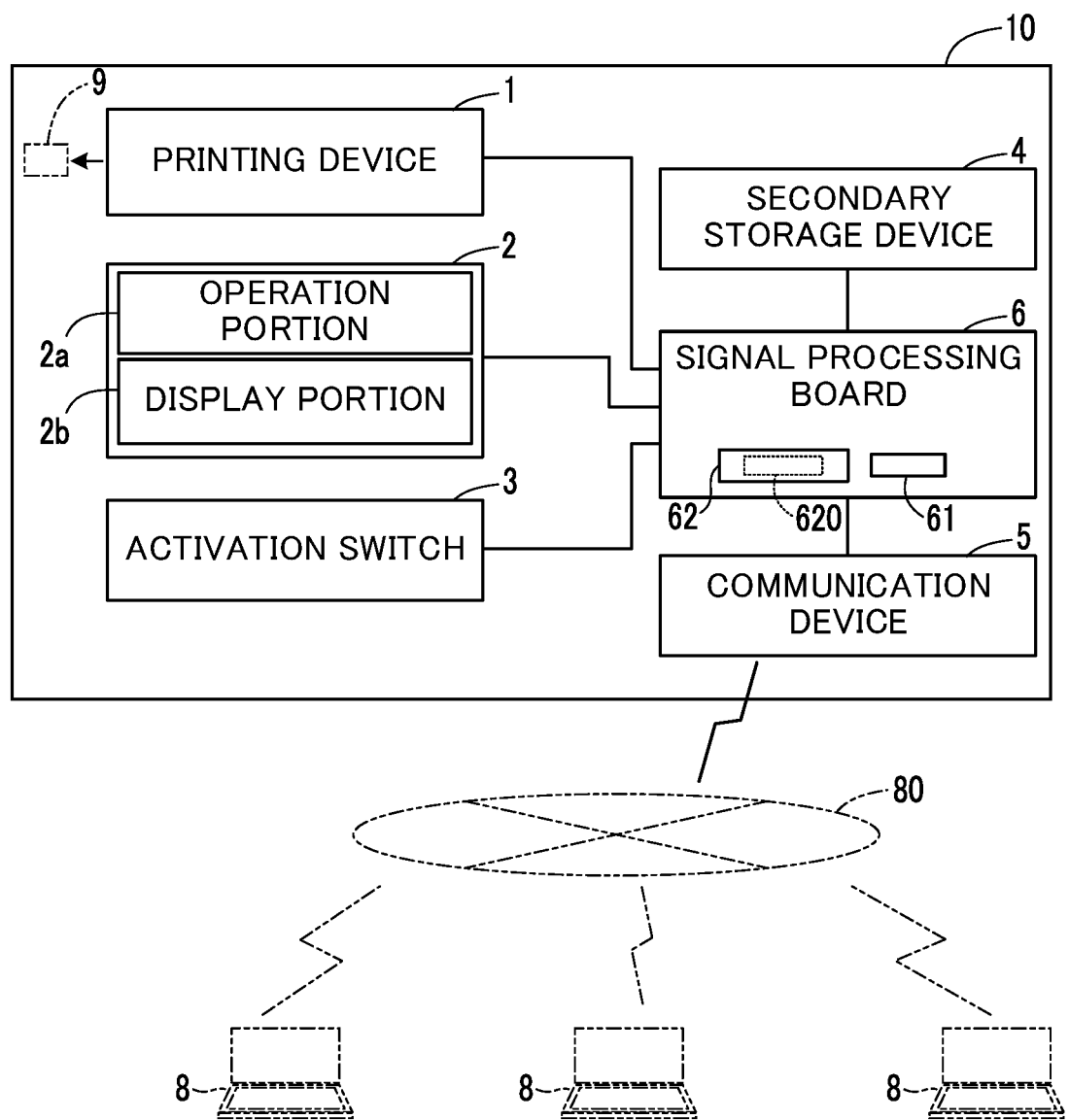
FIG. 1 is a block diagram showing a configuration of an image forming apparatus including a signal processing board according to a first embodiment.

The image forming apparatus 10 can communicate with one or more host devices 8 through a network 80 (see FIG. 1).

When receiving a print request from the host device 8, the image forming apparatus 10 executes print processing. The print processing is processing for forming an image on a sheet 9. For example, the image forming apparatus 10 is a printer, a copier, a facsimile machine, or a multifunction peripheral.

The image forming apparatus 10 includes a printing device 1, an operation unit 2, an activation switch 3, a secondary storage device 4, a communication device 5, and a signal processing board 6.

The printing device 1 executes the print processing. For example, the printing device 1 executes the printing process using an electrophotographic method or an inkjet method. The printing device 1 is an example of a printing portion.

The operation unit 2 is a human interface device such as a touch panel unit. The operation unit 2 includes an operation portion 2a and a display portion 2b. The operation portion 2a is a device that receives a human operation. The display portion 2b is a panel display device capable of displaying information.

The activation switch 3 is an operation switch for detecting a user's operation. As will be described later, the activation switch 3 detects an operation that instructs the image forming apparatus 10 to shift its operation mode.

The secondary storage device 4 is a computer-readable nonvolatile storage device. For example, one or both of a flash memory and a hard disk drive are employed as the secondary storage device 4.

The communication device 5 communicates with one or more host devices 8 through a network 80. The signal processing board 6 receives a processing request from the host device 8 and transmits a response to the host device 8 via the communication device 5.

Figure 2:
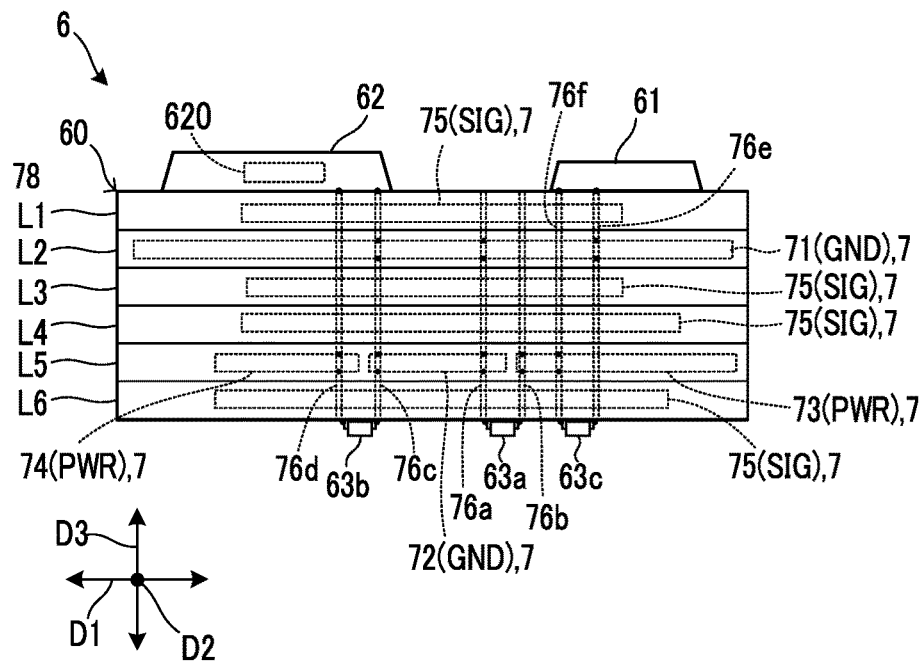
FIG. 2 is a diagram showing distribution of a plurality of wiring planes among six wiring layers of the signal processing board according to the first embodiment.

The signal processing board 6 is a substrate on which one or more memory elements 61 and a processing unit 62 are mounted (see FIG. 2). In the present embodiment, the signal processing board 6 includes two memory elements 61 (see FIG. 3).

The processing unit 62 includes a processor 620 for controlling the printing device 1. The processing unit 62 is, for example, a system-on-a-chip (SoC) or a central processing unit (CPU).

The memory element 61 stores data to be referred to, stored, or updated by the processing unit 62. For example, the memory element 61 is a dynamic random access memory (DRAM).

The processor 620 executes various types of control and data processing by executing computer programs stored in the secondary storage device 4. For example, the processor 620 controls the printing device 1 and the display portion 2b.

The signal processing board 6 includes a six-layer substrate 60. The six-layer substrate 60 is a multilayer substrate in which six wiring layers L1 to L6 are stacked. The memory element 61 and the processing unit 62 are mounted on the six-layer substrate 60.

A plurality of wiring planes 7 are formed in the six wiring layers L1 to L6. The use of the six-layer substrate 50 contributes to downsizing of the signal processing board 6.

The plurality of wiring planes 7 are electrically connected to one or both of the memory element 61 and the processing unit 62.

By the way, the signal processing board 6 operates in a normal mode or a power saving mode. In the normal mode, power is supplied to the processing unit 62, and in the power saving mode, power supply to the processing unit 62 is stopped.

The signal processing board 6 can control the printing device 1 when operating in the normal mode. The power consumption of the signal processing board 6 is smaller when the signal processing board 6 operates in the power saving mode than when the signal processing board 6 operates in the normal mode.

The signal processing board 6 shifts from the normal mode to the power saving mode when a standby condition is satisfied. For example, the standby condition is a condition that a state where no print request is received continues for a predetermined period of time.

The signal processing board 6 returns from the power saving mode to the normal mode when receiving the print request from the host device 8 through the communication device 5 while operating in the power saving mode.

Further, the signal processing board 6 returns from the power saving mode to the normal mode when the activation switch 3 detects a user's return operation while the signal processing board 6 is operating in the power saving mode.

The return operation is an operation for shifting the signal processing board 6 from the power saving mode to the normal mode.

The signal processing board 6 of the image forming apparatus 10 requires two types of power supply planes. One of the two types of power supply planes is de-energized in the power saving mode.

When the signal processing board 6 includes two types of power supply planes, there is a demand to downsize the signal processing board 6 and reduce noise by devising the arrangement of the plurality of wiring planes 7.

The signal processing board 6 has a configuration for achieving downsizing and noise reduction. Hereinafter, the configuration will be described.

[Configuration of Signal Processing Board 6]

In the six-layer substrate 60 of the signal processing board 6, the six wiring layers L1 to L6 include a first layer L1, a second layer L2, a third layer L3, a fourth layer L4, a fifth layer L5, and a sixth layer L6 (see FIG. 2).

The memory element 61 and the processing unit 62 are mounted on the outer surface of the first layer L1 of the six-layer substrate 60 (see FIG. 2).

It is noted that the memory element 61 is an example of a first semiconductor element arranged on the six-layer substrate 60. In addition, the processing unit 62 is an example of a second semiconductor element arranged on the six-layer substrate 60. The processing unit 62 is also an example of a control element for controlling the printing device 1.

In FIG. 2 to FIG. 8, the first direction D1 is a direction in which the memory element 61 and the processing unit 62 are arranged. The memory element 61 and the processing unit 62 are spaced apart from each other in the first direction D1 on the outer surface of the first layer L1.

In FIG. 2 to FIG. 5, the second direction D2 is a direction orthogonal to the first direction D1. The first direction D1 and the second direction D2 are along the surface of the six-layer substrate 60.

In FIG. 2 to FIG. 5, the third direction D3 is a stacking direction of the six wiring layers L1 to L6. That is, the third direction D3 is the thickness direction of the six-layer substrate 60. The third direction D3 is orthogonal to the first direction D1 and the second direction D2.

Figure 3:
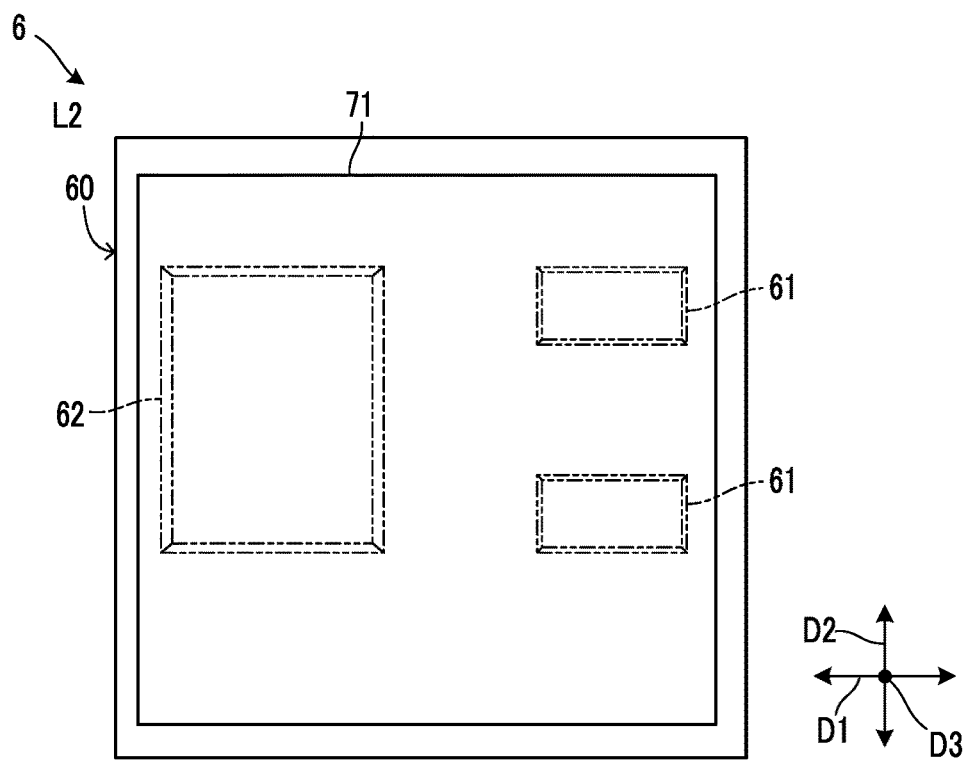
FIG. 3 is a diagram schematically showing a wiring layout of a second layer of the signal processing board according to the first embodiment.
Figure 4:
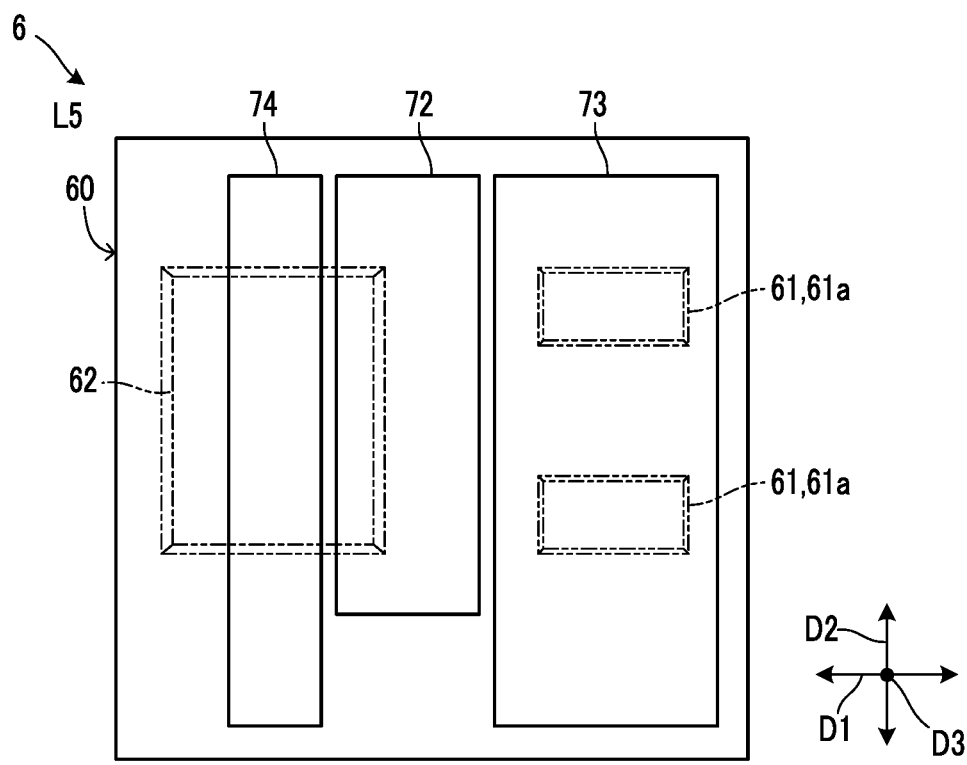
FIG. 4 is a diagram schematically showing a wiring layout of a fifth layer of the signal processing board according to the first embodiment.

In FIG. 3 and FIG. 4, the positions of the memory element 61 and the processing unit 62 when the signal processing board 6 is viewed along the third direction D3 are indicated by imaginary lines (dash-dot-dot-dash lines).

In the present embodiment, the processing unit 62 and the memory elements 61 each have a rectangular shape when viewed along the third direction D3 (see FIG. 3 and FIG. 4). The processing unit 62 is arranged with its longitudinal direction along the second direction D2.

On the other hand, the memory elements 61 are each arranged such that its longitudinal direction is along the first direction D1. The two memory elements 61 are spaced apart in the second direction D2 (see FIG. 3 and FIG. 4).

The plurality of wiring planes 7 include a first ground plane 71, a second ground plane 72, a first power supply plane 73, a second power supply plane 74, and a plurality of signal transmission planes 75 (see FIG. 2).

The plurality of signal transmission planes 75 are formed in the first layer L1, the third layer L3, the fourth layer L4, and the sixth layer L6 (see FIG. 2). The plurality of signal transmission planes 75 are electrically connected to one or both of the signal terminals of the processing unit 62 and the memory element 61.

It is noted that some of the plurality of signal transmission planes 75 are electrically connected across a plurality of layers by a through electrode (not shown).

The first ground plane 71 is formed in the second layer L2 (see FIG. 2 and FIG. 3). The first ground plane 71 is electrically connected to the ground terminal of each of the two memory elements 61 and the processing unit 62.

The first ground plane 71 is formed in a region extending over the two memory elements 61 and the processing unit 62 when viewed along the third direction D3 (see FIG. 3). In the example shown in FIG. 3, the first ground plane 71 is formed in a region including the two memory elements 61 and the processing unit 62 when viewed in the third direction D3.

The second ground plane 72, the first power supply plane 73, and the second power supply plane 74 are formed in the fifth layer L5 (see FIG. 2).

The first power supply plane 73 and the second power supply plane 74 are spaced apart from each other in the first direction D1 (see FIG. 4). The second ground plane 72 is formed in a region between the first power supply plane 73 and the second power supply plane 74 (see FIG. 4).

The second ground plane 72 is electrically connected to the ground terminal of each of the two memory elements 61 and the processing unit 62. The first power supply plane 73 is electrically connected to the power supply terminals of the memory elements 61. The second power supply plane 74 is electrically connected to the power supply terminal of the processing unit 62.

The first power supply plane 73 has a portion overlapping with the two memory elements 61 when viewed along the third direction D3 (see FIG. 4). In the example shown in FIG. 4, the first power supply plane 73 is formed in a region including the two memory elements 61 when viewed in the third direction D3.

The second power supply plane 74 has a portion overlapping with the processing unit 62 when viewed along the third direction D3 (see FIG. 4). In the example shown in FIG. 4, the second power supply plane 74 is formed in a region penetrating the processing unit 62 in the second direction D2 when viewed along the third direction D3.

In the example shown in FIG. 4, the second ground plane 72 has a portion overlapping with the processing unit 62 when viewed along the third direction D3.

The signal processing board 6 includes one or more first bypass capacitors 63a and one or more second bypass capacitors 63b (see FIG. 2). The signal processing board 6 further includes one or more third bypass capacitors 63c.

The first bypass capacitor 63a, the second bypass capacitor 63b, and the third bypass capacitor 63c are each arranged on the outer surface of the first layer L1 or the sixth layer L6. In the example shown in FIG. 2, the first bypass capacitor 63a, the second bypass capacitor 63b, and the third bypass capacitor 63c are mounted on the outer surface of the sixth layer L6.

The first bypass capacitor 63a is electrically connected to the first power supply plane 73 and the second ground plane 72.

In the example shown in FIG. 2, a first terminal of the first bypass capacitor 63a, the first ground plane 71, and the second ground plane 72 are electrically connected by the through electrode 76a. In addition, a second terminal of the first bypass capacitor 63a and the first power supply plane 73 are electrically connected by a through electrode 76b.

The second bypass capacitor 63b is electrically connected to the second power supply plane 74 and the second ground plane 72.

In the example shown in FIG. 2, a first terminal of the second bypass capacitor 63b, the first ground plane 71, and the second ground plane 72 are electrically connected by a through electrode 76c. In addition, the power supply terminal of the processing unit 62, a second terminal of the second bypass capacitor 63b, and the second power supply plane 74 are electrically connected by a through electrode 76d.

The third bypass capacitor 63c is electrically connected to the first ground plane 71 and the first power supply plane 73.

In the example shown in FIG. 2, the ground terminal of each of the memory elements 61, a first terminal of the third bypass capacitor 63c, and the first ground plane 71 are electrically connected by a through electrode 76e. In addition, the power supply terminals of each of the memory elements 61, a second terminal of the third bypass capacitor 63c, and the first power supply plane 73 are electrically connected by a through electrode 76f.

The use of the six-layer substrate 50 contributes to downsizing of the signal processing board 6.

In the signal processing board 6, the power supply to the first power supply plane 73 is cut off in the power saving mode. On the other hand, the power supply to the second power supply plane 74 is maintained in both the normal mode and the power saving mode.

The first ground plane 71 is formed in a wide region of the second layer L2. Therefore, the first ground plane 71 functions as a return path for portions of the plurality of signal transmission planes 75 formed in the first layer L1 and the third layer L3.

The first power supply plane 73, the second power supply plane 74, and the second ground plane 72 are all formed in a relatively narrow region in the fifth layer L5 (see FIG. 4). In this case, the plurality of signal transmission planes 75 include a plane crossover wiring formed over the ground region and the power supply region in one or both of the fourth layer L4 and the sixth layer L6.

In the present embodiment, the plane crossover wiring includes a first crossover wiring and a second crossover wiring. The first crossover wiring is a wiring extending over the first power supply plane 73 and the second ground plane 72 when viewed along the third direction D3. The second crossover wiring is a wiring extending over the second power supply plane 74 and the second ground plane 72 when viewed in the third direction D3.

Therefore, the first power supply plane 73, the second power supply plane 74, and the second ground plane 72 do not function as return paths for portions of the plurality of signal transmission planes 75 formed in the fourth layer L4 and the sixth layer L6.

However, the first bypass capacitor 63a secures a return current path in the first crossover wiring. Similarly, the second bypass capacitor 63b secures a return current path in the second crossover wiring.

Therefore, by employing the signal processing board 6, noise can be reduced even when the plurality of signal transmission planes 75 transmit high-frequency signals.

Second Embodiment

Next, a signal processing board 6A according to a second embodiment will be described with reference to FIG. 5. The signal processing board 6A can be applied to the image forming apparatus 10 instead of the signal processing board 6.

The signal processing board 6A has a configuration in which two memory elements 63, a memory substrate 64, and an IC socket 65 are added to the signal processing board 6.

The two memory elements 63 are arranged on the outer surface of the sixth layer L6 of the six-layer substrate 60. The two memory elements 63 are mounted at positions on the outer surface of the sixth layer L6 overlapping with the two memory elements 61 when viewed along the third direction D3.

The IC socket 65 is mounted on the outer surface of the first layer L1 of the six-layer substrate 60. The IC socket 65 is arranged at a position between the two memory elements 61 and the processing unit 62 in the first direction D1.

The memory substrate 64 is an optional substrate on which a plurality of memory chips are mounted. For example, the plurality of memory chips are DRAM chips.

The memory substrate 64 is attached to the IC socket 65. That is, the IC socket 65 is a socket for the memory substrate 64. The memory substrate 64 is electrically connected to the planes of the six-layer substrate 60 via the IC socket 65.

Therefore, the ground terminal, the power supply terminal, and the signal terminal of the IC socket 65 correspond to the ground terminal, the power supply terminal, and the signal terminal of the memory substrate 64, respectively.

The ground terminal of the memory substrate 64 is electrically connected to the first ground plane 71 and the second ground plane 72. The power supply terminal of the memory substrate 64 is electrically connected to the first power supply plane 73. The signal terminal of the memory substrate 64 is electrically connected to some of the plurality of signal transmission planes 75.

Figure 5:
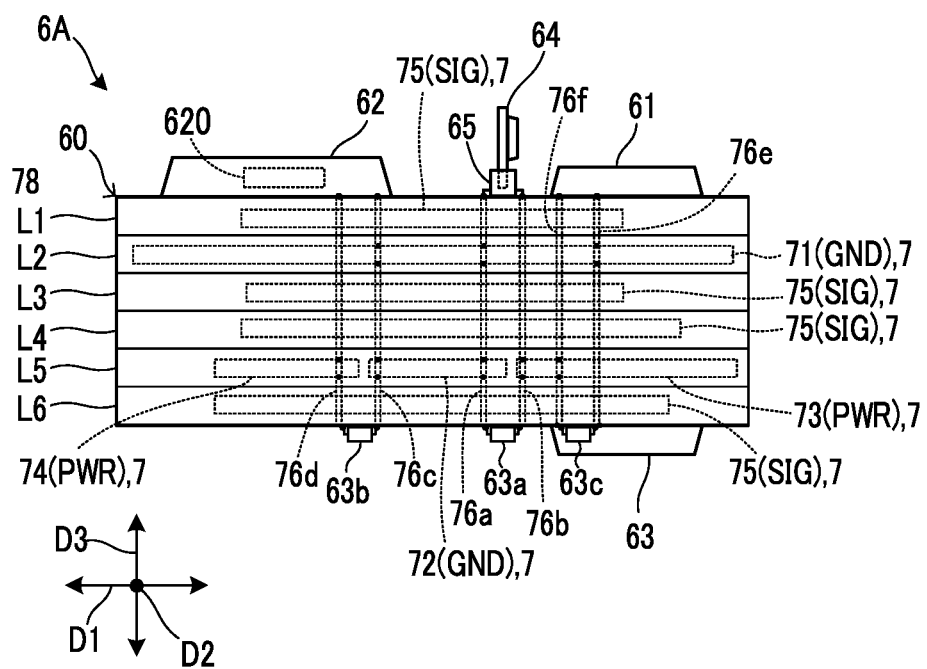
FIG. 5 is a diagram showing distribution of a plurality of wiring planes among six wiring layers of a signal processing board according to a second embodiment.

In the example shown in FIG. 5, the ground terminal of the IC socket 65, the first terminal of the first bypass capacitor 63a, the first ground plane 71, and the second ground plane 72 are electrically connected by the through electrode 76a. The power supply terminal of the IC socket 65, the second terminal of the first bypass capacitor 63a, and the first power supply plane 73 are electrically connected by the through electrode 76b.

In addition, the ground terminal of each of the memory elements 61, the ground terminal of the memory element 63, the first terminal of the third bypass capacitor 63c, and the first ground plane 71 are electrically connected by the through electrode 76e. In addition, the power supply terminal of each of the memory elements 61, the power supply terminal of the memory element 63, the second terminal of the third bypass capacitor 63c, and the first power supply plane 73 are electrically connected by the through electrode 76f.

When the signal processing board 6A is employed, the same effect as that when the signal processing board 6 is employed can be obtained.

It is to be understood that the embodiments herein are illustrative and not restrictive, since the scope of the disclosure is defined by the appended claims rather than by the description preceding them, and all changes that fall within metes and bounds of the claims, or equivalence of such metes and bounds thereof are therefore intended to be embraced by the claims.

The invention claimed is:

1. A signal processing board comprising:
a six-layer substrate in which six wiring layers are stacked;
a first semiconductor element and a second semiconductor element arranged on an outer surface of a first layer of the six wiring layers;
a plurality of signal transmission planes formed in the first layer, a third layer, a fourth layer, and a sixth layer of the six wiring layers and electrically connected to one or both of the first semiconductor element and the second semiconductor element;
a first ground plane formed in a second layer of the six wiring layers and electrically connected to the first semiconductor element and the second semiconductor element;
a first power supply plane formed in a fifth layer of the six wiring layers and electrically connected to the first semiconductor element;
a second power supply plane formed in the fifth layer of the six wiring layers and electrically connected to the second semiconductor element;
a second ground plane formed in the fifth layer of the six wiring layers and electrically connected to the first semiconductor element and the second semiconductor element;
a first bypass capacitor arranged on an outer surface of the first layer or the sixth layer and electrically connected to the first power supply plane and the second ground plane; and
a second bypass capacitor arranged on an outer surface of the first layer or the sixth layer and electrically connected to the second power supply plane and the second ground plane.

2. The signal processing board according to claim 1, wherein the first ground plane is formed in a region extending over the first semiconductor element and the second semiconductor element when viewed along a stacking direction of the six wiring layers.

3. The signal processing board according to claim 1, wherein
the first power supply plane includes a portion overlapping with the first semiconductor element when viewed along a stacking direction of the six wiring layers,
the second power supply plane includes a portion overlapping with the second semiconductor element when viewed along the stacking direction, and
the second ground plane is formed in a region between the first power supply plane and the second power supply plane.

4. The signal processing board according to claim 1, wherein
the first semiconductor element is a memory element, and
the second semiconductor element is an element including a processor.

5. An image forming apparatus comprising:
a printing device configured to form an image on a sheet; and
the signal processing board according to claim 4, on which a memory element and an element including a processor configured to control the printing device are mounted.

* * * * *